United States Patent [19]

Itakura et al.

[11] Patent Number: 4,659,180

[45] Date of Patent: Apr. 21, 1987

[54] METHOD OF MOUNTING GALVANOMETER AND MEANS FOR MOUNTING SAME

[75] Inventors: Toru Itakura; Yuji Ohara; Kazuo Horikawa, all of Kanagawa, Japan

[73] Assignee: Fuji Photo Film Co., Ltd., Kanagawa, Japan

[21] Appl. No.: 569,560

[22] Filed: Jan. 10, 1984

[30] Foreign Application Priority Data

Jan. 10, 1983 [JP] Japan ................... 58-1952

[51] Int. Cl.⁴ .................. G02B 26/10; G02B 7/00
[52] U.S. Cl. .......................... 350/320; 324/97
[58] Field of Search ............ 350/320; 324/77 K, 78 J, 324/97; 174/152 R, 158 R, 165, 167

[56] References Cited

U.S. PATENT DOCUMENTS

| | | | |
|---|---|---|---|
| 2,503,298 | 4/1950 | Richardson | 324/97 |
| 2,573,998 | 11/1951 | Thompson | 324/97 |
| 2,874,353 | 2/1959 | Tavis | 324/97 |
| 3,011,124 | 11/1961 | Hermann et al. | 324/97 |

Primary Examiner—John K. Corbin
Assistant Examiner—Loha Ben
Attorney, Agent, or Firm—Sughrue, Mion, Zinn, Macpeak & Seas

[57] ABSTRACT

A metal mount of a galvanometer is secured to a plate made of an electrically conductive material via a thin insulating layer in electrically insulated relation to the plate. The thin insulating layer has a thickness within the range of about 10 $\mu$m to about 500 $\mu$m. The metal mount and the thin insulating layer are cylindrical and are secured to a cylindrical through hole formed in the plate. Or, the metal mount has an L-shaped cross-section. One section of the L-shaped metal mount is secured to the plate by use of bolts, and the other section thereof is secured to the galvanometer by use of screws. In this case, an insulation sheet is positioned between the one section of the L-shaped metal mount and the plate.

4 Claims, 3 Drawing Figures

METHOD OF MOUNTING GALVANOMETER AND MEANS FOR MOUNTING SAME

BACKGROUND OF THE INVENTION

1. Field of the Invention

This invention relates to a method of mounting a galvanometer on a plate.

2. Description of the Prior Art

Galvanometers are widely used as light deflectors in various optical scanning apparatuses. As is well known, the galvanometers are driven by high frequency signals. However, when two galvanometers are mounted on a plate, which is generally made of a metal, or when a high frequency source exists in the vicinity of the plate supporting a galvanometer, there arises a problem that noise is generated in the high frequency drive signals and, as a result, optical scanning becomes nonuniform.

It is known that, when the plate is made of an electrically conductive material such as a metal and the galvanometer is fixed to the plate in electrically insulated relation thereto, noise generated in the high frequency signals for driving the galvanometer is reduced. Therefore, it has been proposed to reduce noise in the high frequency drive signals by using a mount made of a nonconductive material such as a plastic material for mounting the galvanometer on the plate.

However, the galvanometer mounted on the plate via a mount made of a plastic material or the like is disadvantageous in that, since the rigidity of the mount is low, the galvanometer resonates with vibrations of the other galvanometer mounted on the same plate or with vibrations of other movable devices, and the operation of the galvanometer becomes nonuniform.

SUMMARY OF THE INVENTION

The primary object of the present invention is to provide a method of mounting a galvanometer wherein the galvanometer is secured to a plate so as to minimize noise arising in the high frequency drive signals and vibrations of the galvanometer.

Another object of the present invention is to provide a method of mounting a galvanometer which very simply minimizes scanning nonuniformity.

The method of mounting a galvanometer comprises making a mount for the galvanometer by use of a metal exhibiting high rigidity, and securing the mount to a plate made of a metal or the like via a thin insulating layer in electrically insulated relation to the plate.

In the present invention, since the galvanometer is secured to the plate in an electrically insulated relation thereto, almost no noise is generated in the signals for driving the galvanometer. Further, since the electrical insulation between the mount of the galvanometer and the plate is effected by use of a thin layer, the mount is secured to the plate as if the mount were directly fixed to the plate (that is, as if there were no insulating material between the galvanometer and the plate). Therefore, the galvanometer is scarcely vibrated. Thus, in the present invention, it is possible to very easily minimize scanning nonuniformity.

The thin insulating layer positioned between the mount of the galvanometer and the plate may be made, for example, of a sheet of a plastic material such as polyvinyl chloride or polyethylene. The thickness of the thin insulating layer should preferably be within the range of about 10 $\mu$m to 500 $\mu$m. This is because, if the thickness of the thin insulating layer is more than about 500 $\mu$m, the thin insulating layer dynamically participates in the supporting system for the galvanometer, and the galvanometer becomes susceptible to vibrations as in the case wherein the mount made of a plastic material is used for mounting the galvanometer. On the other hand, if the thickness of the thin insulating layer is less than about 10 $\mu$m, the thin insulating layer becomes readily damaged when the galvanometer is mounted on the plate, and the risk of the thin insulating layer losing its insulating effect increases.

DESCRIPTION OF THE PREFERRED EMBODIMENTS

The present invention will hereinbelow be described in further detail with reference to the accompanying drawings.

Figure 1:
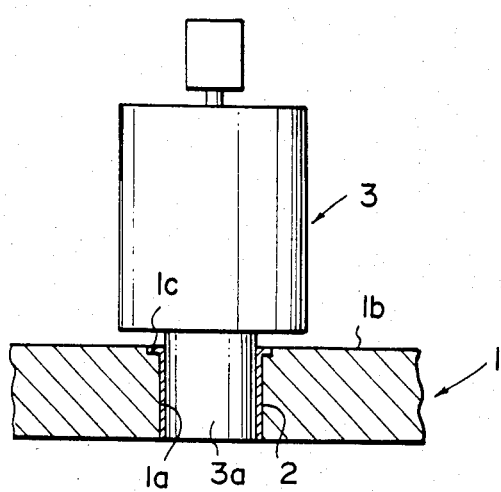
FIG. 1 is a partially cutaway side view showing a galvanometer mounted on a plate by an embodiment of the method in accordance with the present invention.
Figure 2:
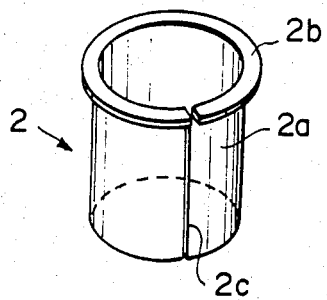
FIG. 2 is a perspective view showing the insulation bushing used in the embodiment of FIG. 1.

FIG. 1 shows the condition of a galvanometer secured to a plate in accordance with an embodiment of the method of the present invention. A plate 1 is made of a metal as in the case of an ordinary plate, and is provided with a mounting hole 1a, which is a cylindrical through hole. In the upper surface 1b of the plate 1 is formed a shallow flange hole 1c which is concentric with the mounting hole 1a and has a diameter larger than the diameter of the mounting hole 1a. Into the mounting hole 1a, a cylindrical insulation bushing 2 as shown in FIG. 2 is inserted from above. Further, a cylindrical metal mount 3a of a galvanometer 3 is inserted from above into the insulation bushing 2.

The insulation bushing 2 is made of an insulating material, e.g. a hard plastic material such as a hard polyvinyl chloride material. The insulation bushing 2 comprises a thin-walled cylindrical section 2a and a flange section 2b formed at the upper portion of the cylindrical section 2a for engagement with the flange hole 1c. The insulation bushing 2 is further provided with a slit 2c extending over the entire length of the insulation bushing 2, so that the insulation bushing 2 is discontinuous in the circumferential direction thereof. The outer diameter of the mount 3a is slightly smaller than the inner diameter of the mounting hole 1a of the plate 1 and is slightly larger than the inner diameter of the insulation bushing 2 (i.e. the inner diameter thereof when the slit 2c is closed). Accordingly, when the mount 3a is inserted into the insulation bushing 2, the slit 2c of the insulation bushing 2 is opened and the diameter of the insulation bushing 2 becomes slightly larger than before. Thus the mount 3a is fitted to the mounting hole 1a via the insulation bushing 2 and, as a result, the galvanometer 3 is secured to the plate 1.

As described above, the plate 1 and the mount 3a are electrically insulated from each other by the insulation bushing 2 intervening therebetween. Therefore, even when the galvanometer 3 and another galvanometer are mounted on the same plate 1 (the latter galvanometer should of course also preferably be mounted in the same manner as the galvanometer 3), noise generated by interference between high frequency drive signals for these galvanometers is reduced, and scanning nonuniformity is minimized. Further, the generation of noise due to a high frequency source or the like positioned near the plate 1 is suppressed.

Further, since the cylindrical section 2a of the insulation bushing 2 is thin-walled (as described above, the wall thickness is within the range of about 10 $\mu$m to about 500 $\mu$m), the metal mount 3a is essentially in the condition directly fitted and secured to the metal plate 1. Therefore, there is no risk of the galvanometer 3 being readily vibrated on the plate 1. In order to suppress the vibrations of the galvanometer 3, the insulation bushing 2 should preferably be made of a hard material.

Though not shown in FIG. 1, fixing of the mount 3a to the plate 1 may be conducted more securely, for example, by use of set screws made of a plastic material.

Figure 3:
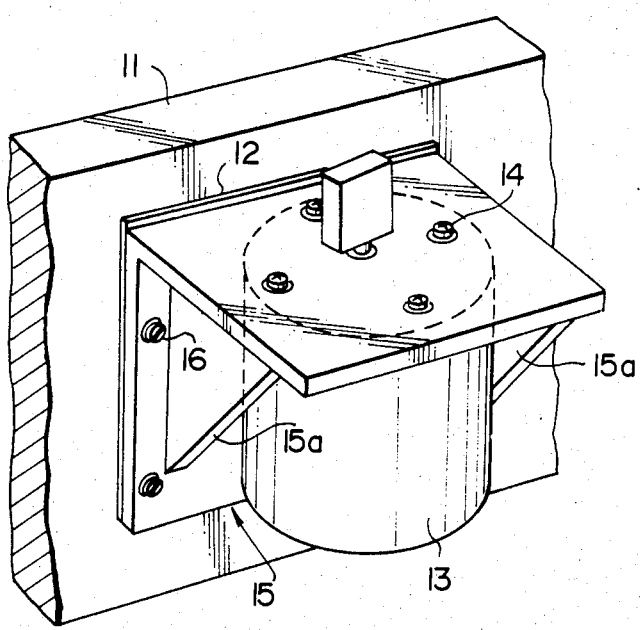
FIG. 3 is a perspective view showing a galvanometer mounted on a plate by another embodiment of the method in accordance with the present invention.

FIG. 3 shows a galvanometer mounted on a plate in accordance with another embodiment of the method of the present invention. In FIG. 3, a galvanometer 13 is secured to a mount 15, which is made of a metal and has an L-shaped cross-section, by use of four screws 14. The mount 15 has support members 15a at the side end portions, and upper and lower bolt holes (not shown) on the outer side of each support member 15a. The mount 15 is secured to a plate 11 by meshing mounting bolts 16 inserted into the aforesaid bolt holes (in FIG. 3, only two mounting bolts 16 on one side of the mount 15 are shown) with bolt holes perforated in the metal plate 11.

Between the mount 15 and the plate 11 is positioned an insulation sheet 12 of the same material and thickness as those of the insulation bushing 2 shown in FIG. 1. Also, the mounting bolts 16 are made of a non-conductive material such as a plastic material, or if they are made of an electrically conductive material, an insulating material is inserted between the mounting bolts 16 and the mount 15. Thus, the mount 15 and the plate 11 are electrically insulated from each other. Therefore, also in this embodiment, it is possible to reduce noise generated in the drive signals for the galvanometer 13 and thereby to minimize scanning nonuniformity. Further, since the thin insulation sheet 12 is used, the mount 15 made of a metal is essentially in the condition directly secured to the metal plate 11 by the bolts 16, and the galvanometer 13 is not readily vibrated.

The insulation bushing 2 and the insulation sheet 12 may be made of any other nonconductive material that can be easily formed into a thin layer and is desirably hard.

We claim:

1. A method of mounting a galvanometer which comprises securing a cylindrical metal mount of the galvanometer to a plate made of an electrically conductive material via a thin cylindrical insulation bushing into which said cylindrical metal mount is inserted such that said metal mount and said plate are in an electrically insulated relation to each other, said plate having a cylindrical through hole for receiving said bushing, and said bushing having a slit extending over the entire length thereof so that said bushing is discontinuous in the circumferential direction thereof.

2. A method of mounting a galvanometer which comprises securing a cylindrical metal mount of the galvanometer to a plate made of an electrically conductive material via a thin cylindrical insulation bushing into which said cylindrical metal mount is inserted such that said metal mount and said plate are in an electrically insulated relation to each other, said plate having a cylindrical through hole for receiving said bushing, and said bushing having a flange section at an upper portion thereof for engagement with a flange hole in an upper surface of said plate, said flange hole being concentric with said through hole and having a diameter larger than the diameter of said through hole.

3. A means for mounting a galvanometer having a metal mount, said means for mounting comprising an external plate made of an electrically conductive material, said plate having a cylindrical through hole, a thin cylindrical insulation bushing having a slit extending over the entire length thereof so that said bushing is discontinuous in the circumferential direction thereof, said metal mount of said galvanometer being inserted into said bushing and said bushing being inserted into said cylindrical through hole of said external plate, whereby said metal mount is secured to said plate and electrically insulated therefrom.

4. A means for mounting a galvanometer having a cylindrical metal mount, said means for mounting comprising:

an external plate made of an electrically conductive material, said plate having a cylindrical through hole, and a flange hole formed in an upper surface of said plate, said flange hole being concentric with said through hole and having a diameter larger than the diameter of the said through hole;

a thin cylindrical insulation bushing having a flange section at the upper portion thereof; and said cylindrical metal mount being inserted into said bushing and said bushing being inserted into said through hole with said flange section of said bushing being engaged with said flange hole of said plate, whereby said metal mount is secured to said plate and is electrically insulated therefrom.

* * * * *